United States Patent
Lin et al.

(10) Patent No.: US 8,987,855 B2
(45) Date of Patent: Mar. 24, 2015

(54) PAD STRUCTURES FORMED IN DOUBLE OPENINGS IN DIELECTRIC LAYERS

(75) Inventors: Jeng-Shyan Lin, Tainan (TW); Dun-Nian Yaung, Taipei (TW); Jen-Cheng Liu, Hsin-Chu (TW); Wen-De Wang, Minsyong Township (TW); Shuang-Ji Tsai, Guiren Township (TW); Yueh-Chiou Lin, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 729 days.

(21) Appl. No.: 13/198,057

(22) Filed: Aug. 4, 2011

(65) Prior Publication Data

US 2013/0032920 A1 Feb. 7, 2013

(51) Int. Cl.
*H01L 27/146* (2006.01)
*H01L 31/18* (2006.01)
*H01L 31/02* (2006.01)

(52) U.S. Cl.
CPC ...... *H01L 27/14636* (2013.01); *H01L 27/1464* (2013.01); *H01L 27/14687* (2013.01)
USPC .......................................... 257/447; 257/443

(58) Field of Classification Search
CPC ..................... H01L 27/1464; H01L 27/14636; H01L 27/14643; H01L 21/6898
USPC .................. 257/291–294, 431–448, E21.001, 257/E31.003
See application file for complete search history.

(56) References Cited

U.S. PATENT DOCUMENTS

| | | | |
|---|---|---|---|
| 7,582,502 B1 | 9/2009 | Hwang et al. | |
| 8,514,308 B2 | 8/2013 | Itonaga et al. | |
| 8,848,075 B2 | 9/2014 | Takahashi et al. | |
| 2005/0194670 A1* | 9/2005 | Kameyama et al. | 257/678 |
| 2007/0145419 A1 | 6/2007 | Park | |
| 2010/0109114 A1* | 5/2010 | Izumi | 257/434 |
| 2011/0233702 A1* | 9/2011 | Takahashi et al. | 257/432 |

FOREIGN PATENT DOCUMENTS

| | | |
|---|---|---|
| CN | 102054849 | 5/2011 |
| CN | 102110700 | 6/2011 |
| KR | 1020070035206 | 3/2007 |
| KR | 100731128 | 6/2007 |
| KR | 20100079087 | 7/2010 |
| KR | 1020110072519 | 6/2011 |

* cited by examiner

*Primary Examiner* — Cuong Q Nguyen
(74) *Attorney, Agent, or Firm* — Slater & Matsil, L.L.P.

(57) ABSTRACT

An image sensor device includes a semiconductor substrate having a front side and a backside. A first dielectric layer is on the front side of the semiconductor substrate. A metal pad is in the first dielectric layer. A second dielectric layer is over the first dielectric layer and on the front side of the semiconductor substrate. An opening penetrates through the semiconductor substrate from the backside of the semiconductor substrate, wherein the opening includes a first portion extending to expose a portion of the metal pad and a second portion extending to expose a portion of the second dielectric layer. A metal layer is formed in the first portion and the second portion of the opening.

20 Claims, 7 Drawing Sheets

PAD STRUCTURES FORMED IN DOUBLE OPENINGS IN DIELECTRIC LAYERS

BACKGROUND

Backside illumination (BSI) image sensor chips are replacing front side illumination sensor chips for their higher efficiency in capturing photons. In the formation of the BSI image sensor chips, image sensors and logic circuits are formed on a silicon substrate of a wafer, followed by the formation of an interconnect structure on a front side of the silicon chip. The interconnect structure includes a plurality of metal layers including bottom metal layer M1 through top metal layer Mtop.

The wafer is then flipped over. A backside grinding is performed on the silicon substrate from the backside of the silicon substrate. A buffer oxide layer may be formed over the back surface of the remaining silicon substrate, and a first opening is formed to extend from the buffer oxide layer to stop at a shallow-trench isolation (STI) pad that is formed in the silicon substrate. A second opening is then formed inside the first opening to further etch the STI pad and the interlayer dielectric (ILD) that is directly under the etched portion of the STI pad, so that a metal pad in the bottom metal layer M1 is exposed. The second opening is smaller than the first opening. An aluminum copper pad is then formed in the first and the second openings and electrically coupled to the metal pad in metal layer M1. The aluminum copper pad may be used for bonding to the BSI chip.

It was found that conventional bond structures may suffer from film peeling during ball shearing tests. The metal pad in the bottom metal layer M1, which metal pad is bonded to the aluminum copper pad, may delaminate from the underlying etch stop layer. The peeling may be caused by the inferior adhesion between the metal pad and the etch stop layer, which is typically formed of silicon carbide.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A pad structure for backside illumination (BSI) image sensor device and the method of forming the same are provided in accordance with various embodiments. The intermediate stages of forming BSI pad structures are illustrated. The variations of the embodiments are discussed. Throughout the various views and illustrative embodiments, like reference numbers are used to designate like elements.

Figure 1:
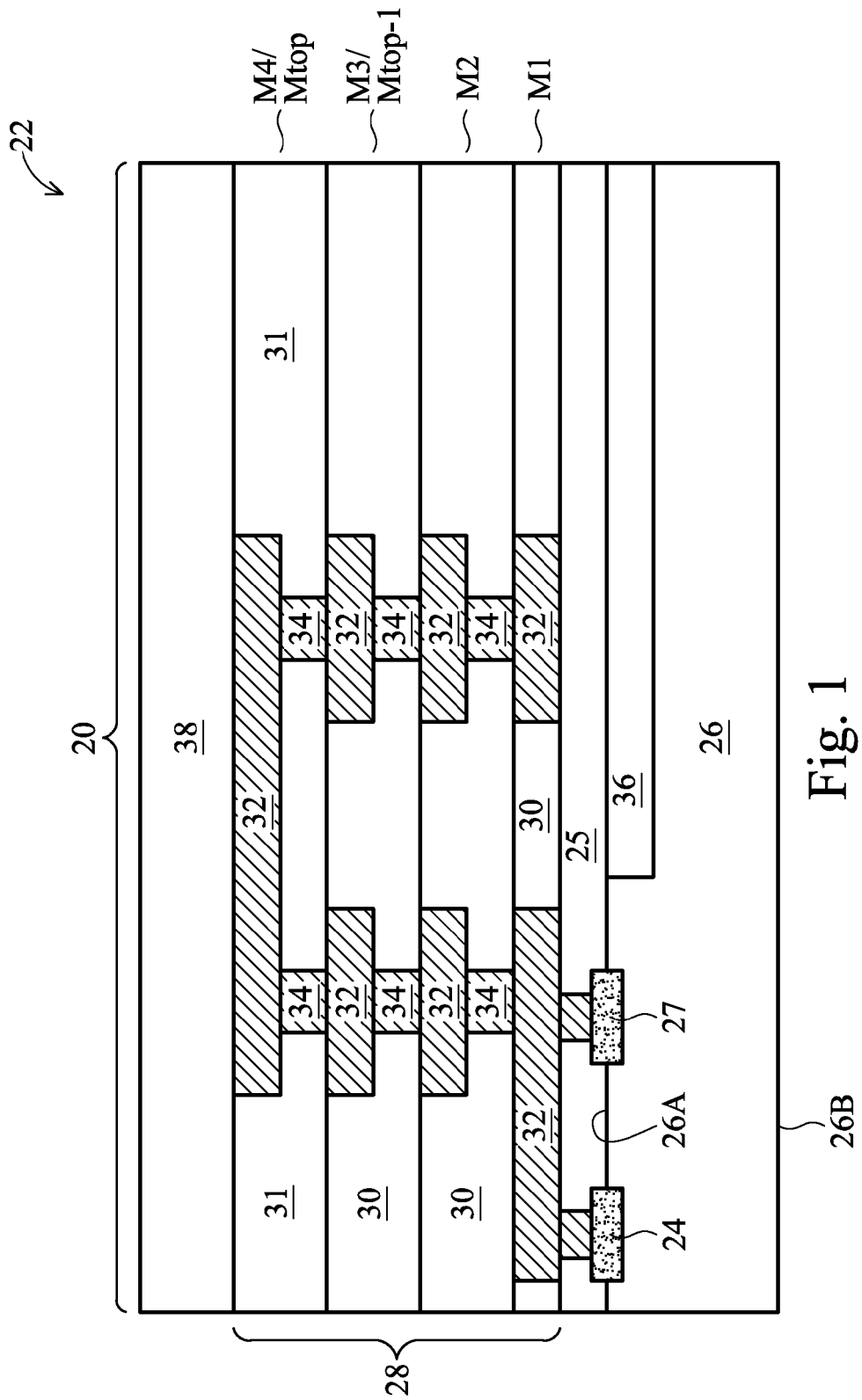
FIGS. 1 through 6 are cross-sectional views of intermediate stages in the manufacturing of a bond pad structure in a backside illumination (BSI) image sensor chip in accordance with various embodiments.

FIGS. 1 through 6 illustrate the cross-sectional views of intermediate stages in the manufacturing of pad structures in accordance with some embodiments. FIG. 1 illustrates image sensor chip 20, which may be part of wafer 22. Image sensor chip 20 includes semiconductor substrate 26, which may be a crystalline silicon substrate or a semiconductor substrate formed of other semiconductor materials. Throughout the description, surface 26A is referred to a front surface of semiconductor substrate 26, and surface 26B is referred to as a backside of semiconductor substrate 26. Image sensor 24, which may be a photo-sensitive MOS transistor or a photo-sensitive diode, is formed at the surface of semiconductor substrate 26. Accordingly, wafer 22 may be an image sensor wafer. Throughout the description, the side that image sensor 24 is on is referred to the front side, and the opposite side is referred to as a backside, of semiconductor substrate 26. Dielectric pad 36, which may be a shallow-trench isolation (STI) pad, extends from a top surface (which is front surface 26A) of semiconductor substrate 26 into semiconductor substrate 26.

Interconnect structure 28 is formed over semiconductor substrate 26, and is used to electrically interconnect the devices in image sensor chip 20. Interconnect structure 28 includes interlayer dielectric (ILD) 25 formed over semiconductor substrate 26, wherein contact plugs (not shown) may be formed in ILD 25. The metal layers include metal lines/pads 32 and vias 34 in dielectric layers 30. Image sensor 24 may be electrically coupled to metal pads/lines 32 and vias 34 in metal layers M1 through Mtop.

The metal layers are marked as M1, M2 ... and Mtop, wherein metal layer M1 is the bottom metal layer of interconnect structure 28, and metal layer Mtop is the top metal layer of interconnect structure 28. In the illustrated embodiments, there are four metal layers, and metal layer Mtop is M4. However, wafer 22 may include more or fewer metal layers. In an embodiment, dielectric layers 30, in which the metal lines 32 and vias 34 of metal layers M1 through M(top-1) are formed, are low-k dielectric layers having low k values, for example, lower than about 3.0. Dielectric layer 31, in which the metal lines 32 and vias 34 of top metal layer Mtop is formed, is formed of a non-low-k dielectric material having a k value greater than 3.9, or greater than about 4.5. In an embodiment, dielectric layer 31 is formed of an oxide such as un-doped silicate glass (USG), boron-silicate glass (BSG), phosphorous-doped silicate glass (PSG), boron-doped phosphor-silicate glass (BPSG), or the like.

Passivation layer 38 is formed over top metal layer Mtop. Passivation layer 38 may be formed of a non-low-k dielectric material having a k value greater than 3.9. In an embodiment, passivation layer 38 is formed of a silicon oxide layer and a silicon nitride layer on the silicon oxide layer.

Figure 2:
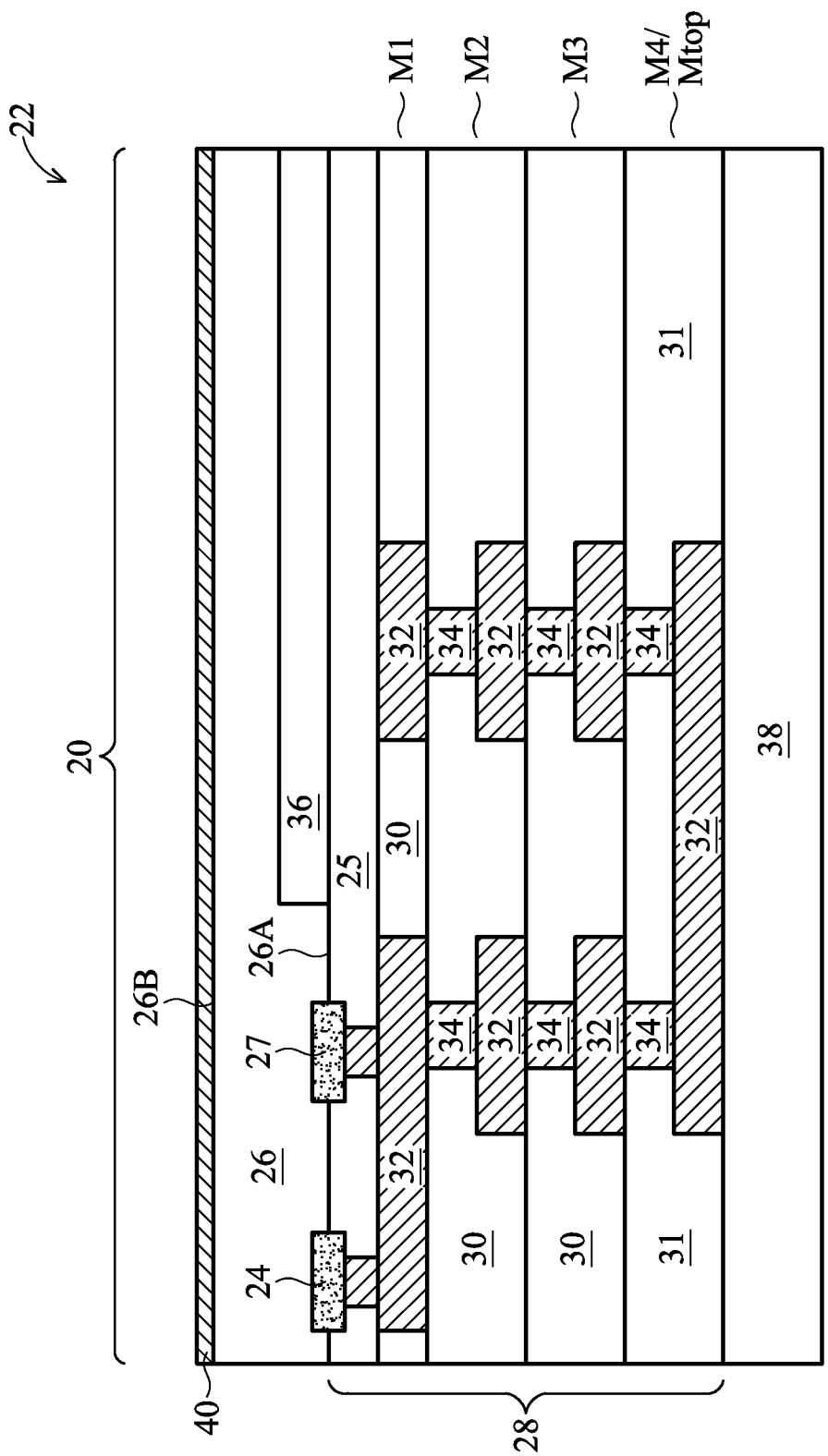

Referring to FIG. 2, wafer 22 is flipped over, and is attached to a carrier (not shown) that is under wafer 22. Accordingly, the top surfaces of each of the features as in FIG. 1 become bottom surfaces, and vice versa. Semiconductor substrate 26 faces up. A backside grinding is performed to thin semiconductor substrate 26, until the thickness of wafer 22 is smaller than about 20 µm, or smaller than about 10 µm, for example. The back surface 26B of the resulting semiconductor substrate 26 is marked. At this thickness, light can penetrate from the backside (which is opposite the front side) of semiconductor substrate 26 through the remaining semiconductor substrate 26, and reach image sensor 24. After the step of thinning, buffer oxide layer 40 may be formed on the surface of semiconductor substrate 26. In an embodiment, buffer oxide layer 40 includes a silicon oxide layer, a bottom anti-reflective coating (BARC) layer over the silicon oxide layer, and another oxide layer over the BARC layer, although buffer layer 40 may have different structures and formed of different materials.

Figure 3:
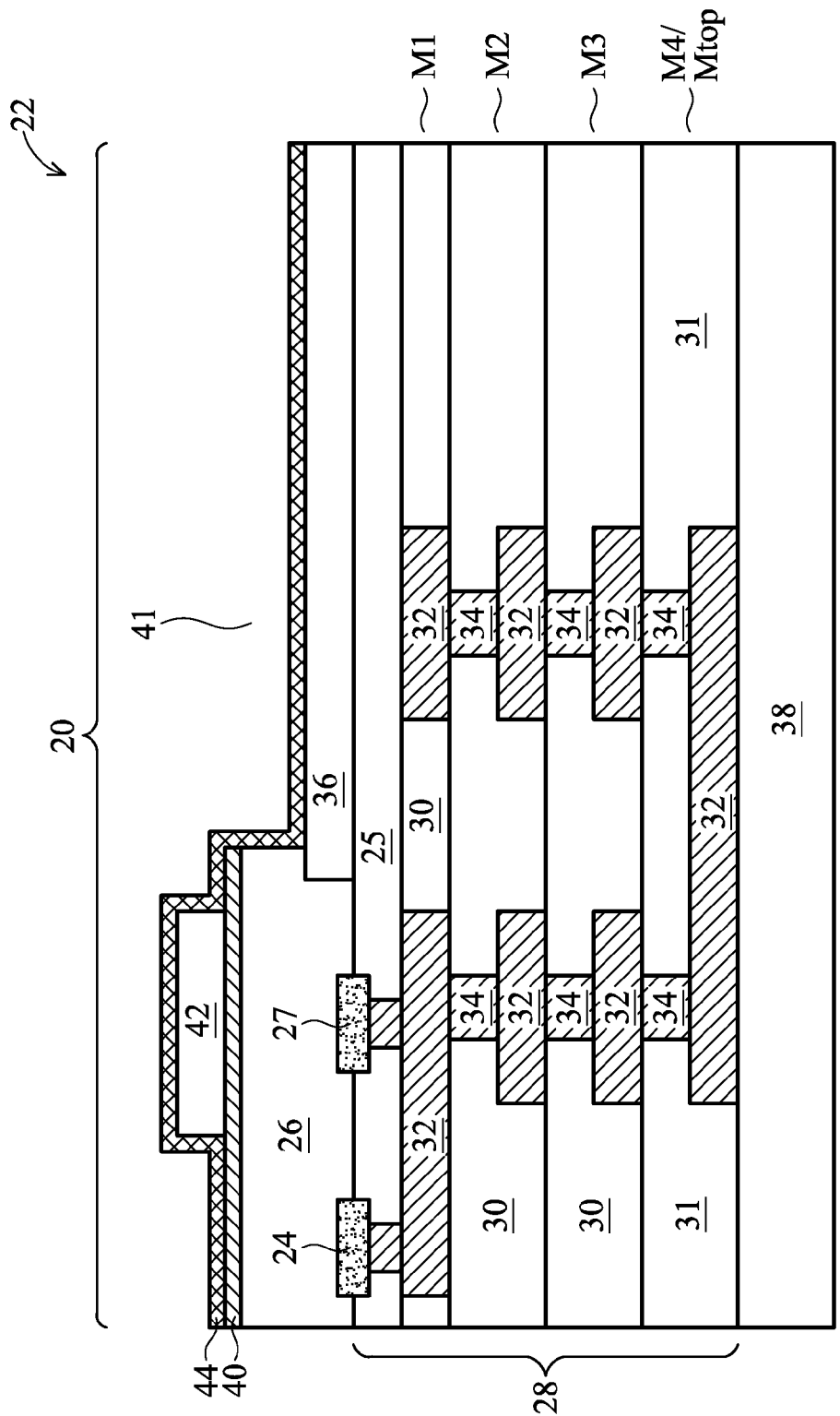

Referring to FIG. 3, buffer oxide layer 40 and semiconductor substrate 26 are etched to form opening 41. In the etch step, STI pad 36 is used as an etch stop layer, and the bottom of opening 41 stops on STI pad 36. Next, metal shield 42 is formed. In an embodiment, the formation of metal shield 42 includes forming a metal layer, and then patterning the metal layer to leave metal shield 42 over portions of semiconductor substrate 26, so that metal shield 42 may block the light from reaching the portions of devices 27 (such as transistors, not shown) that are directly under metal shield 42. Metal shield 42 may comprise aluminum and/or copper. After the formation of metal shield 42, buffer oxide layer 44 is formed. Buffer oxide layer 44 may be formed of a similar material as that of buffer oxide layer 40. Buffer oxide layer 44 comprises a first portion directly over semiconductor substrate 26, and a second portion extending into opening 41. The second portion further includes a portion on the sidewall of semiconductor substrate 26, and a portion directly over STI pad 36.

Figure 4:
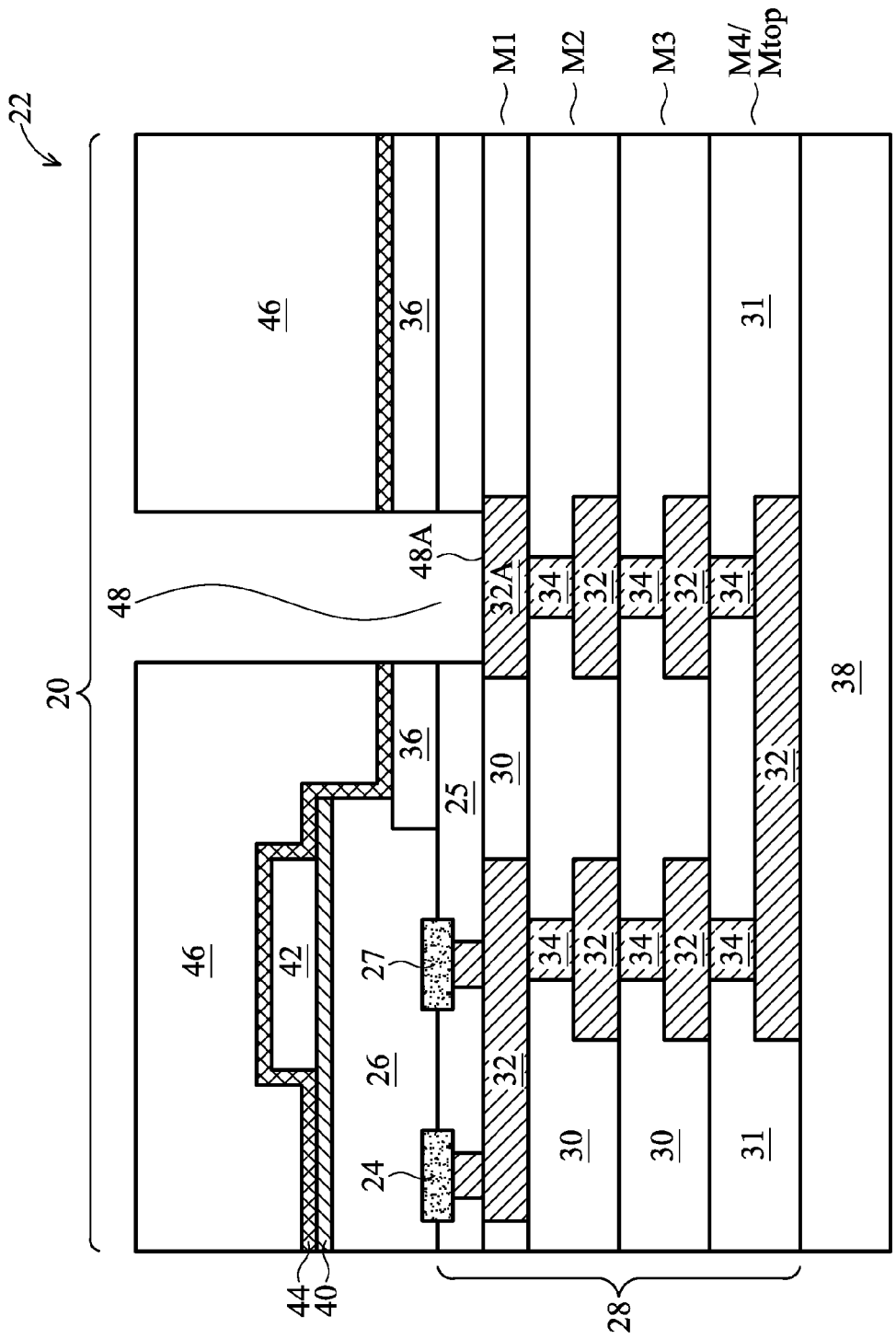

Next, as shown in FIG. 4, photo resist 46 is formed and patterned, and STI pad 36 is etched using photo resist 46 as a mask. Accordingly, opening 48 is formed, with bottom 48A of opening 48 landing on metal pad 32A. During the etching step, both STI pad 36 and ILD 25 are etched, and the etch stops on metal pad 32A. In an embodiment, metal pad 32A is in bottom metal layer M1, although it may also be in other metal layers such as metal layers M2 and M3. As a result, metal pad 32A is exposed to opening 48. Photo resist 46 is then removed.

Figure 5:
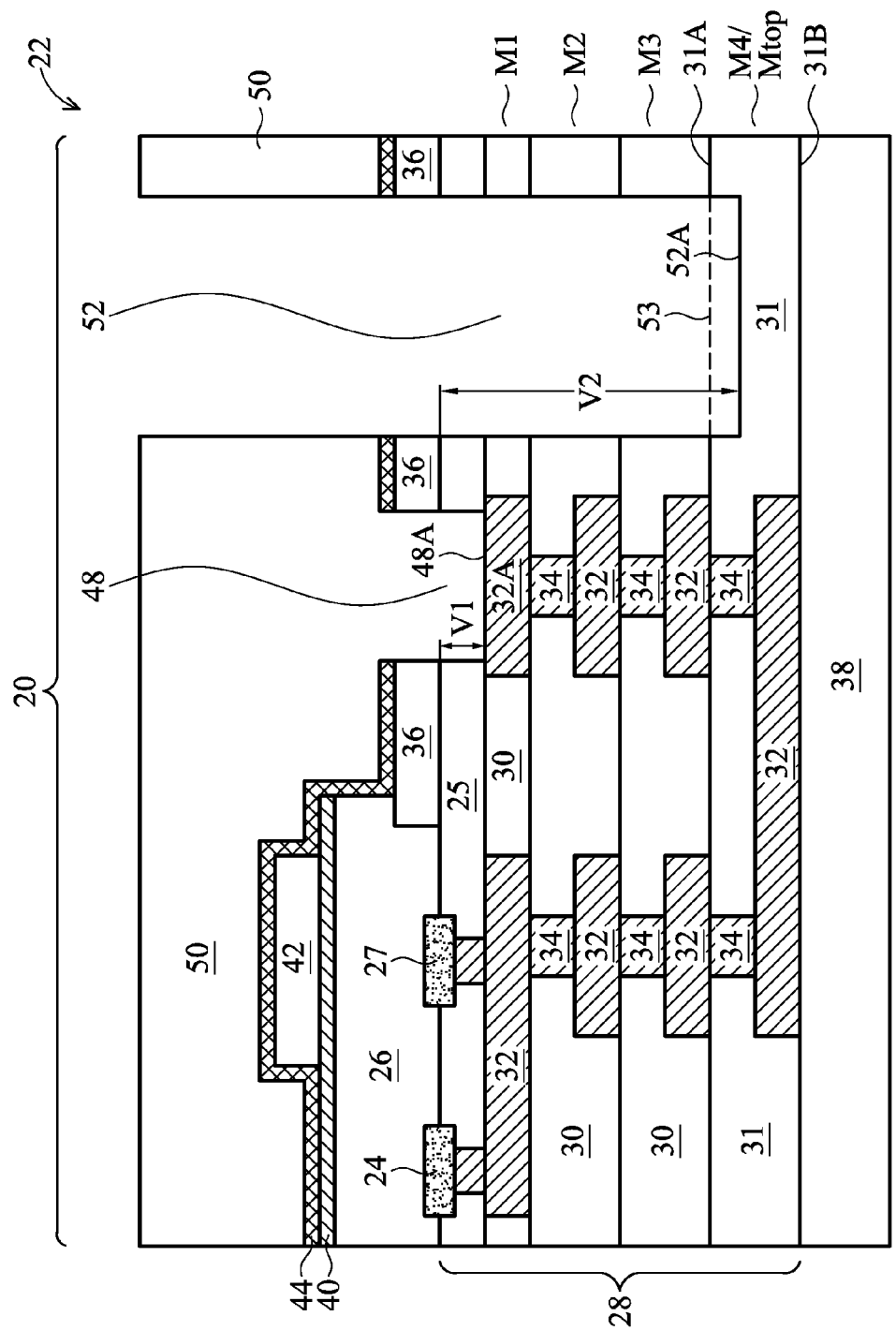

Referring to FIG. 5, photo resist 50 is formed and patterned, and opening 52 is formed. During the etch, the plurality of low-k dielectric layers 30 is etched through, and the etch stops at a level the is level with, or lower than, the top surface 31A of non-low-k dielectric layer 31. Accordingly, vertical distance V2 between bottom surface 52A of opening 52 and semiconductor substrate 26 is greater than vertical distance V1 between bottom surface 48A of opening 48 and semiconductor substrate 26, and hence bottom surface 52A is farther away from semiconductor substrate 26 than bottom surface 48A. In an embodiment, the etch may stop when non-low-k dielectric layer 31 is exposed to opening 52, and the bottom surface 52A of opening 52 is level with the top surface of non-low-k dielectric layer 31. The respective bottom surface 52A of opening 52 is shown using dashed line 53 in accordance with embodiments. Due to the side effect of the over etching, the bottom of opening 52 may also stop at an intermediate level between top surface 31A and bottom surface 31B of non-low-k dielectric layer 31. In alternative embodiments, the bottom of opening 52 may also be level with, or lower than, bottom surface 31B of non-low-k dielectric layer 31. Accordingly, opening 52 may extend into layer 38. After the etch step, photo resist 50 is removed. It is noted that for illustrating the details in metal layers, the aspect ratio of the illustrated opening 52 is much greater than the aspect ratio of the actual opening that is formed on physical wafers. The actual opening may have horizontal dimensions that are significantly greater than, sometimes tens of times as, the height of opening 52. In the resulting structure, openings 41 (FIG. 3), 48 (FIG. 4), and 52 form a continuous opening.

Figure 6:
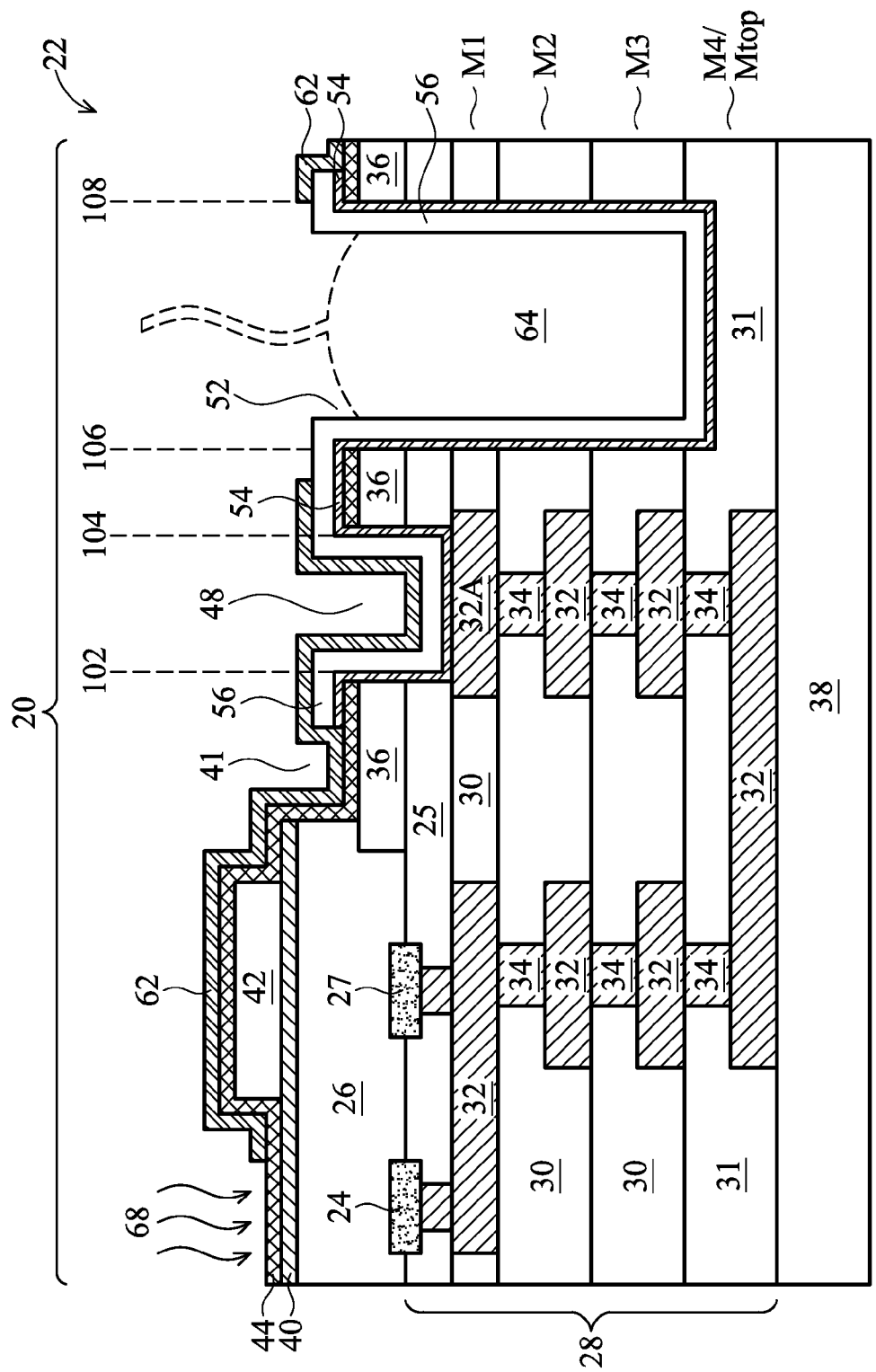

FIG. 6 illustrates the formation and the patterning of glue layer 54 (which is also a barrier layer) and metal layer 56. The formation processes comprise depositing a (conformal) glue layer, depositing a metal pad layer over the glue layer, and patterning the glue layer and the metal pad layer to form the structure shown in FIG. 6. Glue layer 54 may be formed of tantalum, tantalum nitride, titanium, titanium nitride, or the like. Metal layer 56 may be formed of an aluminum-containing metallic material, which may be aluminum copper, for example, although other metals and metal alloys may also be used.

FIG. 6 also illustrates the formation of passivation layer 62, which is formed of a dielectric material. In an embodiment, passivation layer 62 comprises a silicon oxide layer and a nitride layer over the silicon oxide layer, although it may also be formed of other dielectric materials such as USG. Passivation layer 62 is patterned, so that the portion of metal layer 56 in opening 52 is exposed, while the portions of metal layer 56 in opening 48 and the portion of buffer oxide layer 44 directly over metal shield 42 are covered by passivation layer 62. Passivation layer 62 is also removed from directly over image sensor 24, so that color filters and lenses (not shown) may be formed directly over image sensor 24. Accordingly, light (symbolized with curved arrows 68) may penetrate through buffer oxide layers 40 and 44 and semiconductor substrate 26 to reach image sensor 24, which is configured to convert the light to electrical signals.

Figure 7:
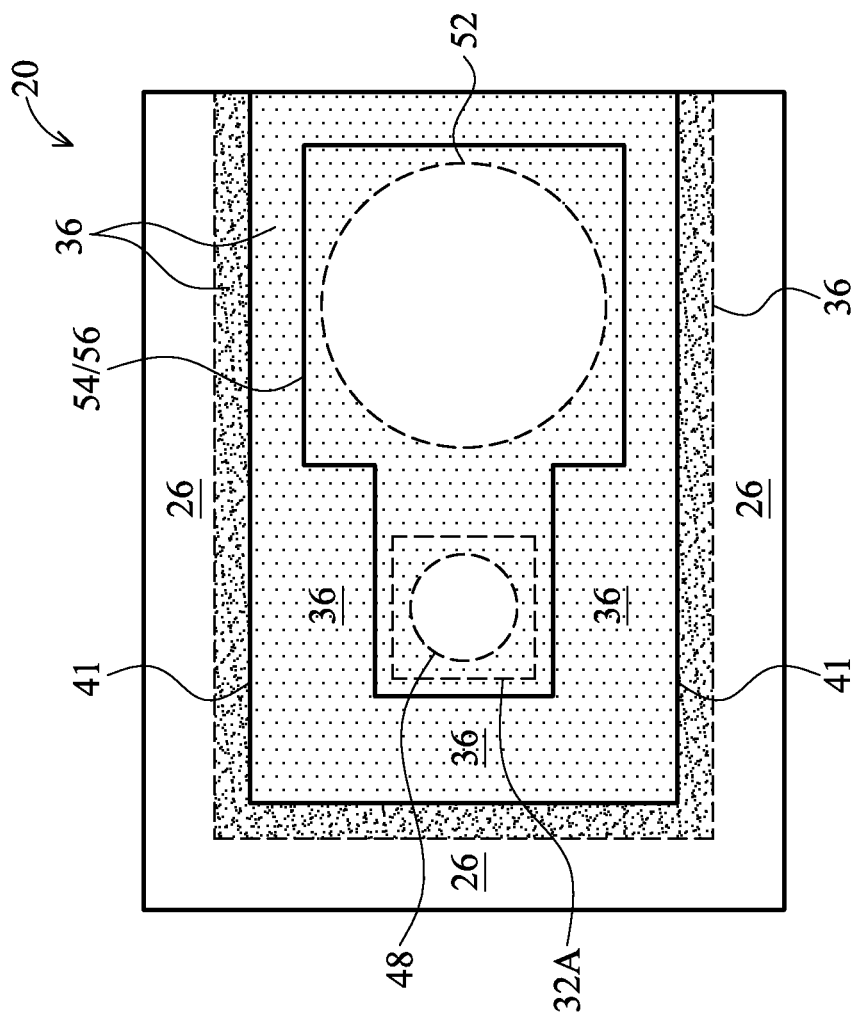
FIG. 7 illustrates a top view of a portion of the structure shown in FIG. 6.

FIG. 7 illustrates a top view of a portion of the structure shown in FIG. 6. It shows that openings 48 and 52 are formed within the boundary of opening 41. STI pad 36 includes portions encircling each of openings 48 and 52.

Referring back to FIG. 6, in an embodiment, a wire bonding is performed to form wire bond bump 64 that is bonded to the bond pad formed of metal layer 56. Wire bond bump 64 may comprise gold, aluminum, or the like. The wire bonding may be performed after wafer 22 is sawed apart into image sensor chips. In the resulting structure, wire bond bump 64 is electrically coupled to metal pad 32A, which is further coupled electrically to other devices such as image sensor 24 and/or the devices 27 that are directly under metal shield 42.

In the embodiments, each of glue layer 54 and metal layer 56 includes three portions, including a first portion in opening 48, a second portion in opening 52, and a third portion interconnecting the first portion to the second portion. The first portion is schematically illustrated as in the region marked between lines 102 and 104. The second portion is schematically illustrated as in the region marked between lines 106 and 108. The third portion is schematically illustrated as in the region marked between lines 104 and 106. The first portions of glue layer 54 and metal layer 56 form the electrical connection to metal pad 32A. The second portions of glue layer 54 and metal layer 56 form a bonding pad that is used for bonding. The third portions act as the electrical connection between the first and the second portions. Since the bonding is performed to the second portions, which land on a non-low-k dielectric material such as non-low-k dielectric layer 31, the likelihood of film delamination is reduced. Glue layer 54 has good adhesion to both meal layer 56 and non-low-k dielectric layer 31, and it is less likely that glue layer 54 and the overlying wire bond bump peel from non-low-k dielectric layer 31. On the other hand, the electrical connection is still made through metal pad 32A.

In accordance with embodiments, an image sensor device includes a semiconductor substrate having a front side and a backside. A first dielectric layer is on the front side of the semiconductor substrate. A metal pad is in the first dielectric layer. A second dielectric layer is over the first dielectric layer and on the front side of the semiconductor substrate. An opening penetrates through the semiconductor substrate from the backside of the semiconductor substrate, wherein the opening includes a first portion extending to expose a portion of the metal pad and a second portion extending to expose a portion of the second dielectric layer. A metal layer is formed in the first portion and the second portion of the opening.

In accordance with other embodiments, a backside illuminated image sensor device includes a semiconductor substrate, and a STI pad extending from a front surface of the semiconductor substrate into the semiconductor substrate. A low-k dielectric layer is overlying the front surface of the semiconductor substrate. A metal pad is disposed in the low-k dielectric layer. A non-low-k dielectric layer is overlying the low-k dielectric layer. A first opening extends from a backside surface of the semiconductor substrate into the semiconductor substrate, passes through the STI pad, and extends to expose a portion of the metal pad. A second opening extends from the backside surface of the semiconductor substrate into the semiconductor substrate, passes through the low-k dielectric layer, and extends to expose a portion of the non-low-k dielectric layer. A metal layer is formed in the first opening and continuously extends to the second opening, wherein the metal layer is electrically coupled to the metal pad.

In accordance with yet other embodiments, a method includes forming an image sensor and an isolation pad on a front side of a semiconductor substrate, and forming a plurality of first dielectric layers over the image sensor and the isolation pad. A metal pad is formed in one of the plurality of first dielectric layers. A second dielectric layer is formed over the plurality of first dielectric layers. A first opening is formed to extend from a backside of the semiconductor substrate to pass through the isolation pad and expose a portion of the metal pad. A second opening is formed from the backside of the semiconductor substrate to pass through the isolation pad and the plurality of first dielectric layers and expose a portion of the second dielectric layer. A metal layer is formed in the first opening and the second opening, wherein the metal layer is electrically coupled to the metal pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An image sensor device comprising:
   a semiconductor substrate having a front side and a backside;
   a first dielectric layer on the front side of the semiconductor substrate;
   a metal pad in the first dielectric layer;
   a second dielectric layer over the first dielectric layer and on the front side of the semiconductor substrate;
   an opening penetrating through the semiconductor substrate from the backside of the semiconductor substrate, wherein the opening comprises a first portion extending to expose a portion of the metal pad and a second portion extending to expose a portion of the second dielectric layer;
   a metal layer formed in the first portion and the second portion of the opening; and
   a bump in the second portion of the opening and electrically coupled to the metal pad through the metal layer.

2. The image sensor device of claim 1, wherein the first dielectric layer is a low-k dielectric layer, and the second dielectric layer is a non-low-k dielectric layer.

3. The image sensor device of claim 1 further comprising an isolation pad extending from the front side of the semiconductor substrate into the semiconductor substrate, wherein the first portion of the opening penetrates through a portion of the isolation pad.

4. The image sensor device of claim 1 further comprising a glue layer in the first portion and the second portion of the opening, wherein the glue layer is formed between the metal layer and the exposed portion of the metal pad, and wherein the glue layer is formed between the metal layer and the exposed portion of the second dielectric layer.

5. The image sensor device of claim 1, wherein the second dielectric layer comprises an un-doped silicate glass (USG) layer.

6. The image sensor device of claim 1, wherein the metal layer in the first portion and the second portion of the opening are electrically coupled to each other.

7. The image sensor device of claim 1 further comprising a passivation layer on a portion of the metal layer that is in the first portion of the opening.

8. A backside illuminated image sensor device comprising:
   a semiconductor substrate;
   a shallow-trench isolation (STI) pad extending from a front surface of the semiconductor substrate into the semiconductor substrate;
   a low-k dielectric layer underlying the front surface of the semiconductor substrate;
   a metal pad in the low-k dielectric layer;
   a non-low-k dielectric layer underlying the low-k dielectric layer;
   a first opening extending from a backside surface of the semiconductor substrate into the semiconductor substrate, passing through the STI pad and extending to expose a portion of the metal pad;
   a second opening extending from the backside surface of the semiconductor substrate into the semiconductor substrate, passing through the low-k dielectric layer and extending to expose a top surface of the non-low-k dielectric layer; and
   a metal layer formed in the first opening and continuously extending to the second opening, wherein the metal layer is electrically coupled to the metal pad, and wherein the metal layer comprises a bottom surface in contact with the top surface of the non-low-k dielectric layer.

9. The backside illuminated image sensor device of claim 8 further comprising a glue layer in the first opening and continuously extending to the second opening, wherein the glue layer is formed between the metal layer and the exposed portion of the metal pad, and the glue layer is formed between the metal layer and the exposed portion of the non-low-k dielectric layer.

10. The backside illuminated image sensor device of claim 8, wherein the metal pad comprises copper.

11. The backside illuminated image sensor device of claim 8 further comprising a bump in the second opening and electrically coupled to the metal pad through the metal layer.

12. The backside illuminated image sensor device of claim 8 further comprising a plurality of low-k dielectric layers between the low-k dielectric layer and the non-low-k dielectric layer.

13. The backside illuminated image sensor device of claim 8 further comprising an image sensor disposed at the front surface of the semiconductor substrate.

14. The backside illuminated image sensor device of claim 8, wherein an entire bottom surface of the portion of the metal layer in the second opening is in contact with the non-low-k dielectric layer.

15. A backside illuminated image sensor device comprising:
- a semiconductor substrate;
- a plurality of image sensors in the semiconductor substrate;
- a plurality of low-k dielectric layers on a front side of the semiconductor substrate, wherein the plurality of low-k dielectric layers is underlying the semiconductor substrate;
- a plurality of metal features in the plurality of low-k dielectric layers;
- a non-low-k dielectric layer underlying the plurality of low-k dielectric layers;
- a conductive layer comprising:
  - a first portion extending from a backside of the semiconductor substrate into the semiconductor substrate, wherein a bottom surface of the first portion contacts a top surface of a metal pad in one of the plurality of metal features;
  - a second portion extending from the backside of the semiconductor substrate into the semiconductor substrate, wherein the second portion extends below the bottom surface of the first portion; and
  - a third portion continuously connecting the first portion to the second portion; and
- a wire bond bump in contact with the second portion of the conductive layer.

16. The backside illuminated image sensor device of claim 15, wherein a bottom surface of the second portion contacts a top surface of the non-low-k dielectric layer.

17. The backside illuminated image sensor device of claim 15, wherein the conductive layer comprises a glue layer and a metal layer over the glue layer, wherein the glue layer contacts the metal pad.

18. The backside illuminated image sensor device of claim 17, wherein the glue layer is further in contact with the non-low-k dielectric layer and the plurality of low-k dielectric layers.

19. The backside illuminated image sensor device of claim 15 further comprising a Shallow Trench Isolation (STI) pad extending into the semiconductor substrate, wherein the first portion of the conductive layer penetrates through the STI pad.

20. The backside illuminated image sensor device of claim 15, wherein the second portion of the conductive layer penetrates through the plurality of low-k dielectric layers to land on the non-low-k dielectric layer.

\* \* \* \* \*